(12) United States Patent
Zhu et al.

(10) Patent No.: US 8,461,650 B2
(45) Date of Patent: Jun. 11, 2013

(54) SEMICONDUCTOR DEVICE AND METHOD FOR MANUFACTURING THE SAME

(75) Inventors: Huilong Zhu, Poughkeepsie, NY (US); Hao Wu, Beijing (CN); Weiping Xiao, Beijing (CN)

(73) Assignee: Institute of Microelectronics, Chinese Academy of Sciences, Beijing (CN)

(*) Notice: Subject to any disclaimer, the term of this patent is extended or adjusted under 35 U.S.C. 154(b) by 0 days.

(21) Appl. No.: 13/202,221

(22) PCT Filed: Mar. 3, 2011

(86) PCT No.: PCT/CN2011/071485
§ 371 (c)(1),
(2), (4) Date: Aug. 18, 2011

(87) PCT Pub. No.: WO2012/088795
PCT Pub. Date: Jul. 5, 2012

(65) Prior Publication Data
US 2012/0319190 A1  Dec. 20, 2012

(30) Foreign Application Priority Data
Dec. 31, 2010  (CN) .......................... 2010 1 0617418

(51) Int. Cl.
*H01L 27/12* (2006.01)
*H01L 21/84* (2006.01)
*H01L 21/336* (2006.01)

(52) U.S. Cl.
USPC .......... 257/347; 257/E27.112; 438/151; 438/157; 438/283; 438/300

(58) Field of Classification Search
USPC .............. 257/77, 329, 369, 183, E29.068, 257/E21.409, E21.632, E27.062, E29.262, 257/E21.41, E27.112, 347; 438/302, 303, 438/305, 306, 369, 370, 372, 505, 506, 519, 438/199, 151, 156, 157, 300
See application file for complete search history.

(56) References Cited

U.S. PATENT DOCUMENTS

| | | | | |
|---|---|---|---|---|
| 5,429,977 A | * | 7/1995 | Lu et al. | 438/242 |
| 5,739,057 A | * | 4/1998 | Tiwari et al. | 438/172 |
| 5,904,535 A | * | 5/1999 | Lee | 438/341 |
| 5,917,219 A | * | 6/1999 | Nandakumar et al. | 257/348 |
| 6,396,108 B1 | * | 5/2002 | Krivokapic et al. | 257/365 |
| 6,610,576 B2 | * | 8/2003 | Nowak | 438/301 |

(Continued)

OTHER PUBLICATIONS

International Search Report and Written Opinion for PCT/CN2011/071485, issued Oct. 13, 2011.

(Continued)

*Primary Examiner* — Mary Wilczewski
*Assistant Examiner* — Erik T Peterson
(74) *Attorney, Agent, or Firm* — China Science Law Group

(57) ABSTRACT

Semiconductor devices and methods for manufacturing the same are disclosed. In one embodiment, the semiconductor device comprises a semiconductor substrate; an insulating layer located on the semiconductor substrate; a semiconductor body located on the insulating layer; a cavity formed in the semiconductor body and into the insulating layer; source/drain regions abutting opposite first side faces of the semiconductor body; gates located on opposite second side faces of the semiconductor body; a channel layer interposed between the respective second side faces and the cavity; and a super-steep-retrograded-well and a halo super-steep-retrograded-well formed in the channel layer. The super-steep-retrograded-well and the halo super-steep-retrograded-well have opposite dopant polarities.

27 Claims, 14 Drawing Sheets

U.S. PATENT DOCUMENTS

| | | | |
|---|---|---|---|
| 6,727,546 B2* | 4/2004 | Krivokapic et al. | 257/331 |
| 6,800,885 B1* | 10/2004 | An et al. | 257/275 |
| 6,939,751 B2* | 9/2005 | Zhu et al. | 438/151 |
| 6,974,983 B1 | 12/2005 | Hill et al. | |
| 7,002,214 B1* | 2/2006 | Boyd et al. | 257/351 |
| 7,601,574 B2* | 10/2009 | Pan | 438/183 |
| 2002/0033511 A1* | 3/2002 | Babcock et al. | 257/408 |
| 2003/0178677 A1* | 9/2003 | Clark et al. | 257/347 |
| 2004/0007170 A1* | 1/2004 | Ang et al. | 117/89 |
| 2004/0256647 A1* | 12/2004 | Lee et al. | 257/289 |
| 2004/0256700 A1* | 12/2004 | Doris et al. | 257/627 |
| 2005/0112817 A1* | 5/2005 | Cheng et al. | 438/219 |
| 2005/0145941 A1* | 7/2005 | Bedell et al. | 257/348 |
| 2005/0156202 A1* | 7/2005 | Rhee et al. | 257/213 |
| 2006/0063332 A1* | 3/2006 | Doyle et al. | 438/267 |
| 2008/0001227 A1 | 1/2008 | Zhu et al. | |
| 2009/0026530 A1 | 1/2009 | Wilson et al. | |

OTHER PUBLICATIONS

English Abstract of CN1790738.
English Abstract of CN1825552.

* cited by examiner

SEMICONDUCTOR DEVICE AND METHOD FOR MANUFACTURING THE SAME

CROSS-REFERENCE TO RELATED APPLICATION(S)

This application is a U.S. National Phase Application of International Application No. PCT/CN2011/071485, filed on Mar. 3, 2011, entitled "SEMICONDUCTOR DEVICE AND METHOD FOR MANUFACTURING THE SAME," which claims priority to Chinese Application No. 201010617418.9, filed on Dec. 31, 2010, both of which are incorporated herein by reference in their entirety.

TECHNICAL FIELD

The present disclosure relates to the semiconductor field, and particularly, to semiconductor devices and methods of manufacturing the same.

BACKGROUND

As channel lengths of Metal Oxide Semiconductor Field Effect Transistors (MOSFETs) continue to shrink, many effects which are negligible in a long channel model of MOSFETs become more prominent and even become dominant factors affecting device performance. These effects are generally called short channel effects. The short channel effects tend to degrade the electrical performances of the devices. For example, the short channel effects will cause problems such as decrease of threshold voltage on a gate, increase of power consumption, and decrease of signal to noise ratio.

In order to control the short channel effects, more impurities such as phosphor and boron have to be doped in the channel. However, this will cause decrease of carrier mobility in a device channel, and further, the gradient of the distribution of the impurities doped in the channel may be difficult to control, which may instead cause serious short channel effects. Furthermore, conventional SiGe PMOS strained silicon technology has encountered a bottleneck and can hardly provide stronger strain to a channel. Moreover, the thickness of the gate oxide dielectric also encounters a bottleneck, and thus the rate of a thickness of gate oxide to become thinner can hardly keep up with reduction of gate width, causing increased leakage through gate dielectric. Critical dimensions continue to shrink, and causing resistances of source/drain regions and power consumption of devices continue to increase.

A trend in the industry is to improve conventional planar device technology to reduce a thickness of a channel region and thus to reduce an electrically neutral region at the bottom of a depletion layer in a channel, such that the depletion layer in the channel can fill the whole channel region. Devices functioning as above are called Fully Depleted devices. In contrast, conventional planar devices belong to Partially Depleted devices.

However, in order to manufacture Fully Depleted devices, the thickness of a silicon layer in a channel has to be very thin. The conventional manufacturing process, especially the conventional bulk-silicon based manufacturing process, can hardly make a structure satisfying such requirements, and is costly. Even the new SOI (silicon on insulator) process can hardly control a very thin silicon layer in a channel region. Research and development of Fully Depleted devices have turned to three-dimensional device structures, i.e., the Fully Depleted double-gate or triple-gate technology.

The three-dimensional device structures (also called vertical devices) refer to such a structure in which a cross section of source/drain is not on the same plane as that of a gate. Those structures are referred to as Fin Field Effect Transistor (FinFet) structures. In a three-dimensional device structure, a channel region is not included in bulk silicon or SOI, so a very thin fully depleted channel can be made by, for example, etching.

FIG. 1 shows a proposed three-dimensional semiconductor device. The semiconductor device comprises: a semiconductor body 20 located on an insulating layer 10; source/drain regions 30 abutting opposite first side faces 22 of the semiconductor body 20; gates 40 located on second side faces 24 of the semiconductor body 20 which are adjacent to the first side faces 22. A gate dielectric layer and a work function metal layer may be interposed between the respective gates 40 and the semiconductor body 20, but are not shown in FIG. 1. In order to reduce the resistance of source/drain regions, the end portion of the source/drain regions 30 may be expanded. Namely, the width (in the xx' direction) of the respective source/drain regions 30 is larger than the thickness of the semiconductor body 20. However, with the increase of the width (d) of the source/drain regions 30, the parasitic capacitance between the source/drain regions 30 and the gates 40 increases, resulting in an increased resistance-capacitance delay and degraded AC performance of the device.

BRIEF DESCRIPTION OF THE DRAWINGS

All cross-sectional views described below are obtained by cutting respective structures along a section line (AA') shown in corresponding top views.

DETAILED DESCRIPTION

Figure 1:
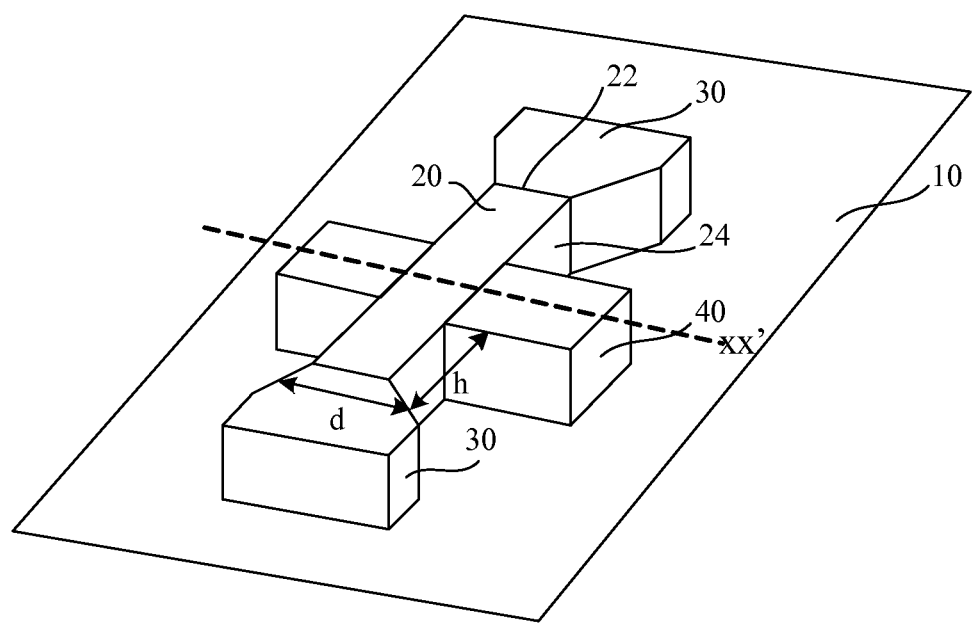
FIG. 1 is a structural diagram schematically showing a semiconductor device according to the prior art.

Various embodiments of semiconductor devices and associated methods of manufacturing are described below. The description below provides examples of various specific processes and/or materials. However, those skilled in the art will appreciate other processes and/or materials may also be used without departing from the scope of the present technology. It should be noted that the relative relationships between various structures described herein include necessary extensions required by the processes or manufacturing procedures. For example, the term "perpendicular to" generally refers to an angle of departure between two planes from 90 degrees is within a range acceptable by processes or manufacturing procedures. A person skilled in the relevant art will also understand that the technology may have additional embodiments, and that the technology may be practiced without several of the details of the embodiments described below with reference to FIGS. 2-31.

Embodiments of the present technology provide semiconductor devices with reduced short channel effects, reduced resistance of source/drain regions and the parasitic capacitances as well as methods for manufacturing such semiconductor devices. Embodiments of the present technology also allow adjustment of threshold voltage of such semiconductor devices.

In one embodiment, a semiconductor device includes a semiconductor substrate; an insulating layer located on the semiconductor substrate; a semiconductor body located on the insulating layer; a cavity formed in the semiconductor body and into the insulating layer; source/drain regions abutting opposite first side faces of the semiconductor body; gates located on opposite second side faces of the semiconductor body; a channel layer interposed between the respective second side faces and the cavity; a super-steep-retrograded-well and a halo super-steep-retrograded-well formed in the channel layer, wherein the super-steep-retrograded-well and the halo super-steep-retrograded-well have opposite dopant polarities.

In another embodiment, a method for manufacturing a semiconductor device includes forming an insulating layer on a semiconductor substrate; forming a semiconductor base on the insulating layer; forming source/drain regions abutting opposite first side faces of the semiconductor base; forming gates on opposite second side faces of the semiconductor base; removing portions of both the semiconductor base and the insulating layer, to form a cavity in the semiconductor base and into the insulating layer, and a channel layer and a mask layer between the respective second side faces and the cavity; forming a super-steep-retrograded-well in the channel layer; forming a third spacer in the cavity, the third spacer abutting the channel layer; and forming a halo super-steep-retrograded-well in the channel layer, and the super-steep-retrograded-well and the halo super-steep-retrograded-well have opposite dopant polarities.

After the cavity is formed, a second ion implantation is performed in the cavity, so as to form the super-steep-retrograded-well in the channel layer(s), which helps to make the depletion layer(s) thinner and to further reduce short channel effects.

Forming the halo super-steep-retrograded-well in the channel region(s) can improve suppression of short channel effects, and can effectively control threshold voltage. The threshold voltage of a long channel device can be decreased but the threshold voltage of a short channel device may not be significantly affected.

Forming the insulating body in the semiconductor device can increase a distance between respective gates formed on the respective second side faces of the semiconductor body and thus to increase the distance between the gates and the source/drain region, while the channel regions in the semiconductor body still has substantially the same thickness. Therefore, parasitic capacitance can be reduced compared to conventional devices.

Further, due to the introduction of the insulating body, the cross-sectional area of the outer part of the semiconductor body can be increased when the thickness of the channel regions of the semiconductor body keep substantially the same as that of a conventional channel region and the height of the semiconductor body keeps unchanged. Consequently, the cross-sectional area of the source/drain regions abutting the semiconductor body increases (due to the increase of the width of the source/drain regions), which helps to further reduce the resistance of the source/drain regions.

The introduction of the insulating body forms a separation region between the source region and the drain region, which helps to reduce short channel effects. Moreover, the stress (e.g. tensile stress for a PMOS device, and compressive stress for an NMOS device) in the insulating body can be adjusted, such that the stress in the insulating body can act on the semiconductor body to produce an opposite type of stress in the semiconductor body (i.e., to produce compressive stress in the semiconductor body for a PMOS device, and tensile stress in the semiconductor body for an NMOS device). This helps to further adjust the stress in the channel regions of the device and further improve the carrier mobility in the channel regions.

The number of masks needed is reduced and the process is refined by forming a sacrificial layer on the semiconductor layer, forming a first spacer and a second spacer surrounding the sacrificial layer, and then forming the semiconductor body using the self-aligned technology with the first spacer and the second spacer as a hard mask.

The effective channel region is increased and the carrier mobility in the channel region is also increased by forming the gates at least covering the channel layers in the direction generally perpendicular to the insulating layer. Stress can also be applied generally uniformly to the channel regions by forming the insulating body at least covering the channel layers in the direction perpendicular to the insulating layer.

The source/drain regions can be formed by firstly forming a semiconductor assistance body and then forming the source/drain regions on the semiconductor assistance body. Further, when the semiconductor assistance body comprises silicon (Si), the material of the source/drain regions may comprise $Si_{1-x}Ge_x$ for the PMOS device, and Si:C for the NMOS device. In this way, the stress in the channel regions can be adjusted by the source/drain regions and thus the carrier mobility in the channel regions can be increased. When the source/drain regions are formed with the foregoing technique, a source/drain base layer (e.g., a seed layer, which may be a remaining portion of the first semiconductor layer) may be formed before the formation of source/drain regions.

Figure 2:
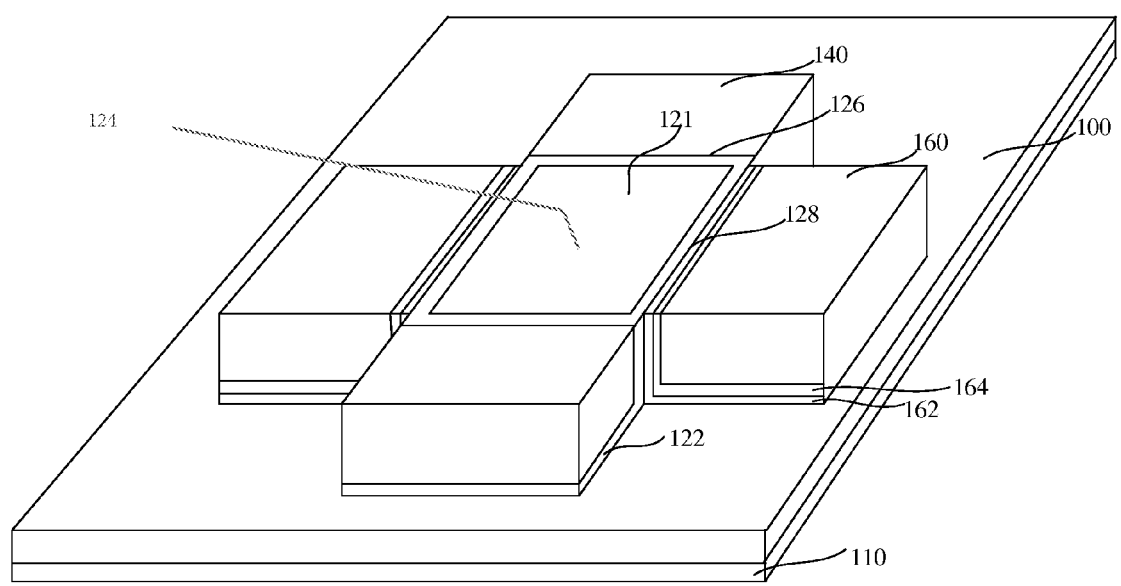
FIG. 2 is a structural diagram schematically showing a semiconductor device according to embodiments of the present technology.

FIG. 2 is a structural diagram schematically showing a semiconductor device according to embodiments of the present technology. As shown in FIG. 2, the semiconductor device comprises: a semiconductor body on an insulating layer 100 located on a semiconductor substrate 110; a cavity 121 in the semiconductor body and into the insulating layer 100; source/drain regions 140 abutting opposite first side faces 126 of the semiconductor body; gates 160 located on opposite second side faces 128 of the semiconductor body; a channel layer interposed between the respective second side faces 128 and the cavity 121; and a super-steep-retrograded-well and a halo super-steep-retrograded-well formed in the channel layer. The super-steep-retrograded-well and the halo super-steep-retrograded-well have opposite dopant polarities. Optionally, the semiconductor device may also comprise a spacer (not shown) in the cavity 121 and abutting the channel layer.

For an NMOS device, the channel layer comprises a p-type super-steep-retrograded-well. For a PMOS device, the channel layer comprises an n-type super-steep-retrograded-well. Such a structure helps to reduce the thickness of the depletion layer and further reduce short channel effects. For an NMOS device comprising a p-type super-steep-retrograded-well, an n-type halo super-steep-retrograded-well may be formed. For a PMOS device comprising an n-type super-steep-retrograded-well, a p-type halo super-steep-retrograded-well may be formed. The halo super-steep-retrograded-well can effectively reduce the threshold voltage of a long channel device without significantly affecting the threshold voltage of a short channel device.

The source/drain regions 140 may be formed on a semiconductor assistance body 122 via epitaxial growth. In embodiments in which the semiconductor assistance body 122 comprises Si, the material of the source/drain regions 140 may comprise $Si_{1-x}Ge_x$ for a PMOS device. The range of x is 0<x<1, preferably 0.1-0.7. The value of x may be adjusted according to the process requirements, and may be 0.2, 0.3, 0.4, 0.5, 0.6, and/or other suitable values. The value of x throughout the specification is substantially the same as described here unless it is otherwise particularly defined, and duplicated descriptions thereof are omitted.

For an NMOS device, the material of the source/drain regions 140 may comprise Si:C, in which the atom percentage of C may be 0.2%-2%, e.g., 0.5%, 1%, or 1.5%. The content of C may be adjusted according to the process requirements. The atomic percentage of C throughout the specification is substantially the same as that described here unless it is otherwise particularly defined, and thus, duplicated descriptions thereof will be omitted. Such a structure helps the source/drain regions 140 to further adjust the stress in the channel region, and thus to increase the carrier mobility in the channel region.

The gates 160 may be formed on the second side faces 128, via a stack of a gate dielectric layer 162 and a work function metal layer 164. The gate dielectric layer 162 may comprise a hafnium based material, such as $HfO_2$, HfSiO, HfSiON, HfTaO, HfTiO, and HfZrO, or any combination thereof. The gate dielectric layer 162 may also comprise any one of aluminum oxide, lanthanum oxide, zirconium oxide, silicon oxide, and silicon oxynitride, combinations thereof, or any combinations of any of the above materials with a hafnium based material. For example, the gate dielectric layer 162 may have a multi-layer structure where the materials of adjacent layers may be different. The work function metal layer 164 may comprise any one of TiN, TiAlN, TaN, and TaAlN, or any combination thereof. The gates 160 may be a metal gate, and preferably a polysilicon gate, which is advantageous to process control.

Forming an insulating body in the cavity 121 can increase the distance between the respective gates 160 formed on the second side faces 128 of the semiconductor body having substantially the same thickness of the channel region as the prior art, and thus increase the distance between the gates 160 and the source/drain regions 140, which helps to reduce the parasitic capacitances. Further, due to the introduction of the insulating body 124, the area of the outer surface of the semiconductor body can be increased when the thickness of the channel regions of the semiconductor body keeps substantially the same as a that of a conventional channel region and the height of the semiconductor body keeps unchanged compared as the prior art. Consequently, the cross-sectional area of the source/drain regions 140 abutting the semiconductor body increases (due to the increase of the width of the source/drain regions 140), which helps to further reduce the resistances of the source/drain regions 140.

Further, due to the introduction of the insulating body 124, a separation region is formed between the source and drain regions 140, which helps to reduce the short channel effects. Furthermore, the stress (e.g., tensile stress for a PMOS device, and compressive stress for a NMOS device) in the insulating body 124 can be adjusted, such that the stress in the insulating body 124 applies to the semiconductor body and thus will produce an opposite type of stress in the semiconductor body (i.e., to produce compressive stress in the semiconductor body for the PMOS device, and tensile stress in the semiconductor body for the NMOS device). This helps to further adjust the stress in the channel region of the device to further improve the carrier mobility in the channel regions.

The insulating body 124 at least covers the channel layer in a direction perpendicular to the insulating layer 100, which helps to apply the stress generally uniformly to the channel region. The material of the insulating body 124 comprises any one of silicon nitride and silicon oxide, or any combination thereof.

Figure 3:
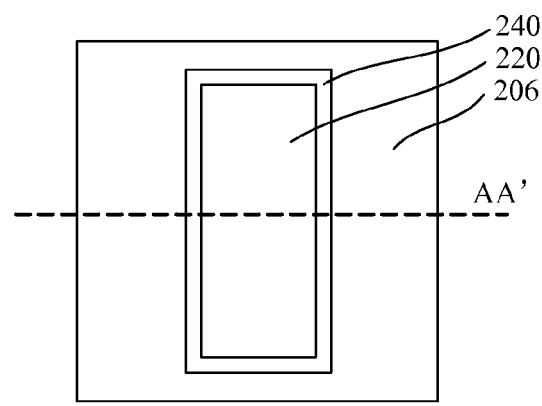
FIG. 3 and FIG. 4 respectively show a top view and a sectional view of a structure after a protection layer and a sacrificial layer patterned during manufacturing of a semiconductor device according to embodiments of the present technology.
Figure 4:
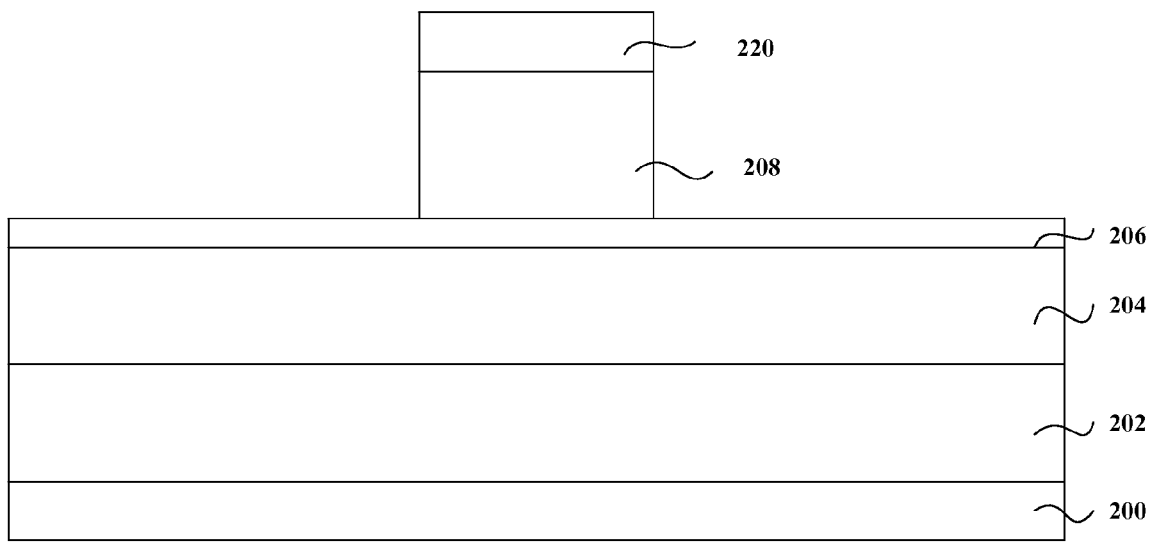

Embodiments of a method for manufacturing the semiconductor device in FIG. 2 are described below with reference to FIGS. 3-31. As shown in FIGS. 3 and 4, a stop layer 206 (which may comprise silicon oxide), a sacrificial layer 208 (which may comprise amorphous silicon) and a protection layer 220 (which may comprise silicon nitride) are sequentially formed on a silicon-on-insulator. The silicon-on-insulator comprises an insulating layer 202 and a silicon comprising layer 204, which is a first semiconductor layer, sequentially formed on a substrate 200. The substrate 200 is preferably a silicon substrate. The material of the silicon comprising layer 204 may comprise any one of Si, SiGe, SiC, and SiGeC, any combination thereof, and/or other suitable substrate materials. The protection layer 220 and the sacrificial layer 208 are patterned via, e.g., etching, which may stop at the stop layer 206.

The thickness of the silicon comprising layer 204 may be 50 nm-100 nm, e.g., 60 nm, 70 nm, 80 nm, or 90 nm; the thickness of the stop layer 206 may be 5 nm-20 nm, e.g., 8 nm, 10 nm, 15 nm, or 18 nm; the thickness of the sacrificial layer 208 may be 30 nm-80 nm, e.g., 40 nm, 50 nm, 60 nm, or 70 nm; the thickness of the protection layer 220 may be 20 nm-50 nm, e.g., 25 nm, 30 nm, 35 nm or 40 nm. In other embodiments, the foregoing components may have other suitable thickness values.

Figure 5:
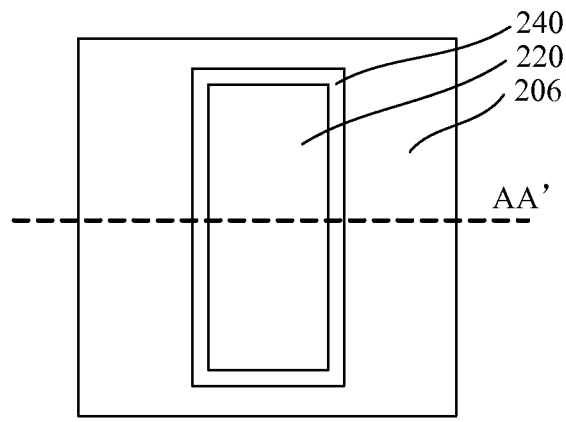
FIG. 5 and FIG. 6 respectively show a top view and a sectional view of a structure after a first spacer is formed during manufacturing of a semiconductor device according to embodiments of the present technology.
Figure 6:
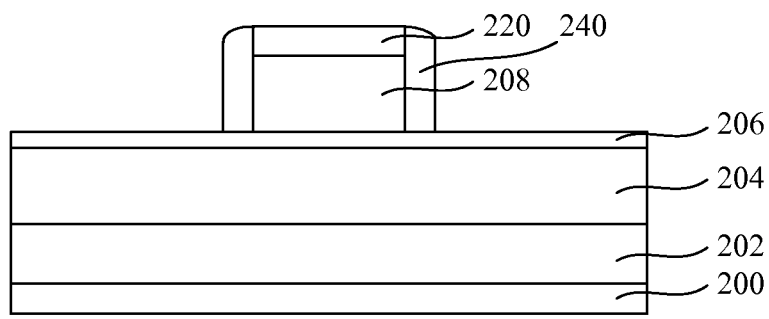

As shown in FIGS. 5 and 6, a first spacer 240 surrounding the patterned sacrificial layer 208 is formed. The material of the first spacer 240 may comprise silicon nitride. In one embodiment, the first spacer 240 may be formed by depositing silicon nitride to a thickness of 15-20 nm and subsequently etched via reactive ion etching. In other embodiments, the first spacer 240 may comprise other suitable materials and/or formed via other suitable techniques.

Figure 7:
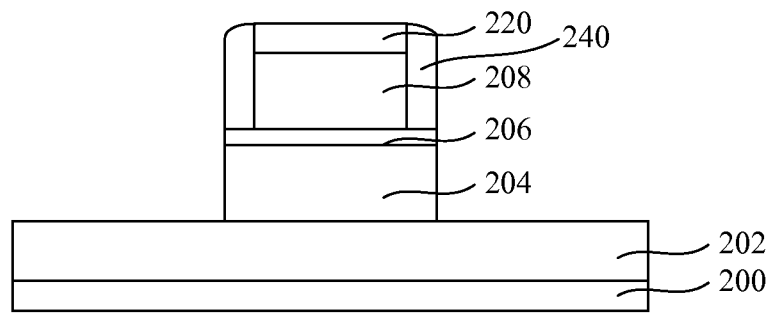
FIG. 7 shows a sectional view of a structure after a stopping layer and a silicon layer are patterned during manufacturing of a semiconductor device according to embodiments of the present technology.

As shown in FIG. 7, the stop layer 206 and the silicon comprising layer 204 are patterned using the first spacer 240 as a mask. The patterning process may be performed by etching and/or other suitable techniques, which may stop at the insulating layer 202.

Figure 8:
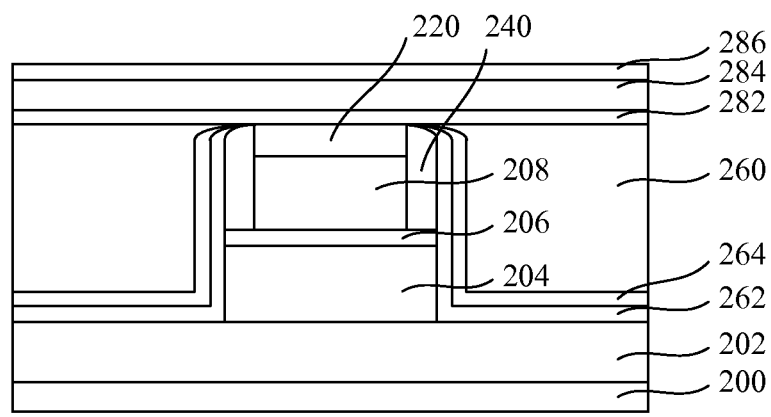
FIG. 8 shows a sectional view of a structure after a gate stack is formed during manufacturing of a semiconductor device according to embodiments of the present technology.

Subsequently, a gate, or a gate stack comprising a gate, may be formed. The gate stack comprises a gate dielectric layer, a work function metal layer, and a polysilicon layer which are sequentially stacked. The polysilicon layer can be substituted with a stacked metal layer. As shown in FIG. 8, a gate stack is formed on the insulating layer 202. The gate stack comprises a gate dielectric layer 262, a work function metal layer 264, and a gate material layer 260 which are sequentially stacked. The gate dielectric layer 262 may comprise a hafnium based material, such as HfO2, HfSiO, HfSiON, HfTaO, HfTiO, and HfZrO, or any combination thereof. The gate dielectric layer 262 may also comprise any one of aluminum oxide, lanthanum oxide, zirconium oxide, silicon oxide, and silicon oxynitride, or any combination thereof, or any combination of any of the above materials with a hafnium based material.

The work function metal layer 264 may comprise any one of TiN, TiAlN, TaN, and TaAlN, or any combination thereof. The gate material layer 260 may comprise metal, and preferably comprises polysilicon. Then the gate stack is planarized to expose the protection layer 220. Then an assistance mask layer is formed to cover the gate stack and the protection layer 220. The assistance mask layer may comprise stacked dielectric layers of different materials. For example, when the protection layer 220 and the first spacer 240 include silicon nitride, the assistance mask layer may comprise a silicon oxide layer (e.g., a first assistance mask layer 282), a silicon nitride layer (e.g., a second assistance mask layer 284), a silicon oxide layer (e.g., a third assistance mask layer 286). After the foregoing processes, only the silicon oxide layer can be seen from the top of the substrate carrying the above described structures.

The thickness of the gate dielectric layer 262 may be 2 nm-3 nm, e.g., 2.5 nm. Further, an interfacial oxide layer may be formed before the gate dielectric layer 262 is formed. The thickness of the interfacing oxide layer (not shown) may be 0.2 nm-0.7 nm, e.g., 0.5 nm. The thickness of the work function metal layer 264 may be 3 nm-10 nm, e.g., 5 nm or 8 nm; the thickness of the gate material layer 260 may be 50 nm-100 nm, e.g., 60 nm, 70 nm, 80 nm, or 90 nm; the thickness of the first assistance mask layer 282 may be 2 nm-5 nm, e.g., 3 nm or 4 nm; the thickness of the second assistance mask layer 284 may be 10 nm-20 nm, e.g., 12 nm, 15 nm, or 18 nm; and the thickness of the third assistance mask layer 286 may be 10 nm-20 nm, e.g., 12 nm, 15 nm, or 18 nm. In other embodiments, the foregoing components may have other suitable thickness values.

Figure 9:
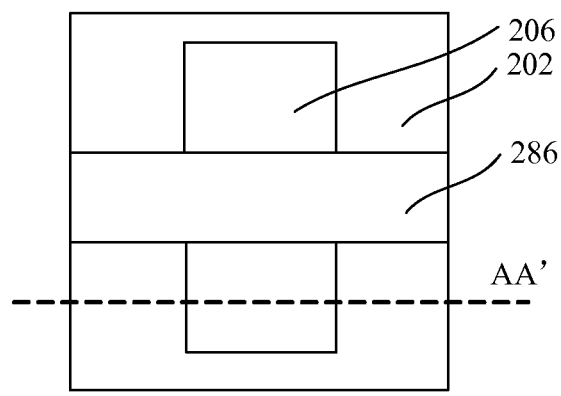
FIG. 9 and FIG. 10 respectively show a top view and a sectional view of a structure after a stopping layer in source/drain regions is exposed during manufacturing of a semiconductor device according to embodiments of the present technology.
Figure 10:
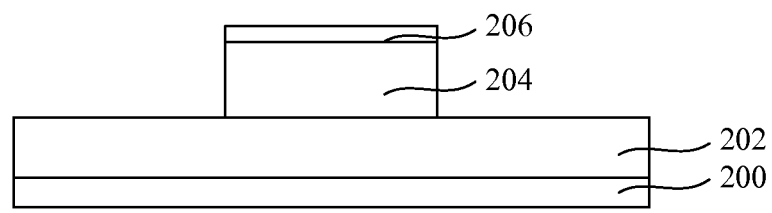
Figure 11:
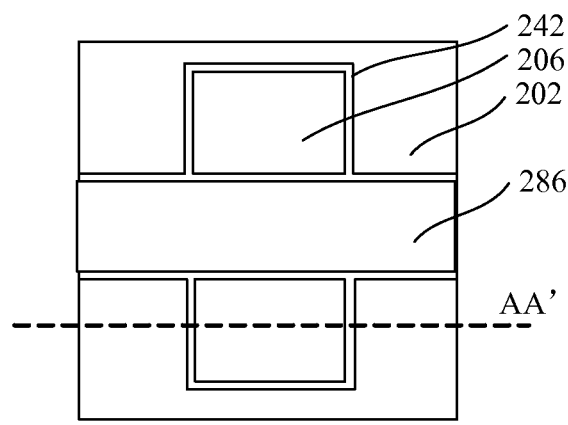
FIG. 11 and FIG. 12 respectively show a top view and a sectional view of a structure after a second spacer is formed during manufacturing of a semiconductor device according to embodiments of the present technology.
Figure 12:
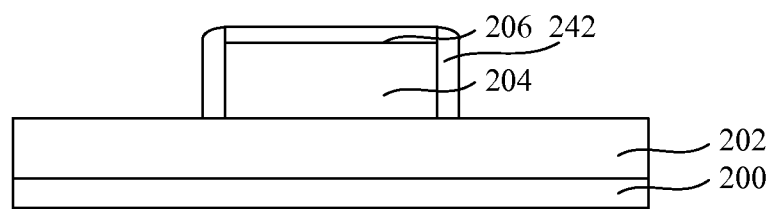

As shown in FIGS. 9 and 10, the source/drain regions are formed by removing portions of the first spacer 240, the protection layer 220, and the sacrificial layer 208, to expose the stop layer 206. Meanwhile, the side faces (not shown) of the protection layer 220 abutting the source/drain regions and side faces (not shown) of the sacrificial layer 208 abutting the source/drain regions are also exposed. Then as shown in FIGS. 11 and 12, a second spacer 242 (which may comprise silicon nitride) surrounding the patterned stop layer 206 and silicon comprising layer 204 is formed.

As such, a semiconductor base is formed. In the illustrated embodiment, the "first side face" refers to a side face exposed after the portions corresponding to the source/drain region are removed. After the source/drain regions and the gate are formed, the protection layer 220, the sacrificial layer 208, the stop layer 206, the silicon comprising layer 204, and the insulating layer 202 are removed using the first spacer 240 and the second spacer 242 as a mask, so as to expose the substrate 200 and form a cavity. The semiconductor base is formed by the self-aligned technology to reduce the number of used masks and simplify the process. The thickness of the second spacer 242 may be 7 nm-20 nm, e.g., 10 nm, 15 nm, 18 nm, or other suitable values.

Figure 13:
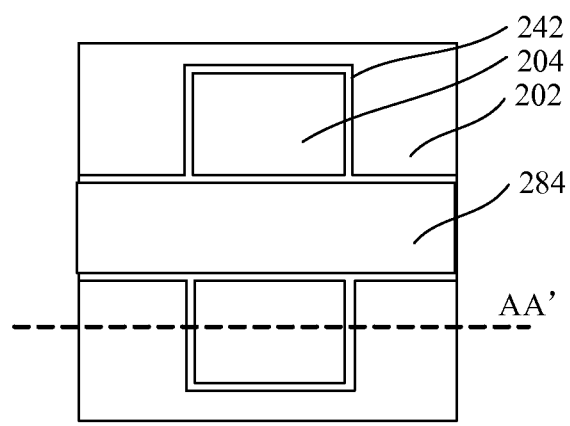
FIG. 13 and FIG. 14 respectively show a top view and a sectional view of a structure after a source/drain base layer is formed in source/drain regions during manufacturing of a semiconductor device according to embodiments of the present technology.
Figure 14:
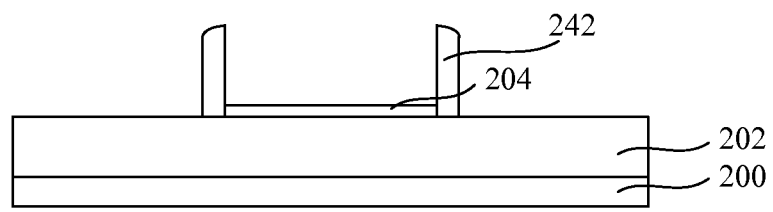

As shown in FIGS. 13 and 14, after the semiconductor base is formed, the portions of the stop layer 206 in the source/drain regions are removed and the silicon comprising layer 204 of a partial thickness in the source/drain regions are removed (and at the same time the third assistance mask layer 286 (the silicon oxide layer) on the gate stack is also removed) to form a source/drain base layer (i.e., a semiconductor assistance body). The thickness of the source/drain base layer may be less than the thickness of the channel layer to be formed, and may be 5 nm-20 nm, e.g., 10 nm or 15 nm.

Figure 15:
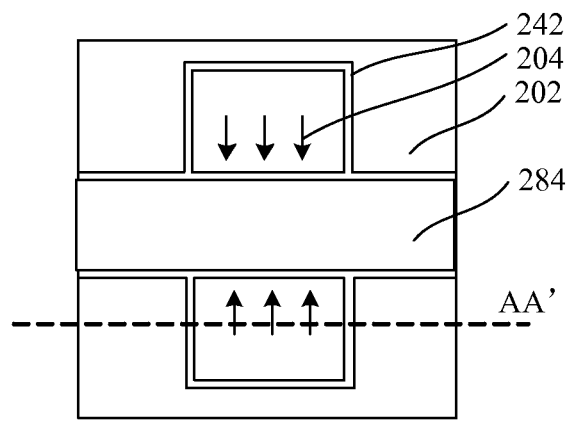
FIG. 15 shows a top view of a structure on which a first ion implantation is performed after a source/drain base layer is formed during manufacturing of a semiconductor device according to embodiments of the present technology.

Then, optionally, as shown in FIG. 15, a first ion implantation is performed in a direction (indicated by arrows in the FIG. 15) facing the first side face (the first side face is the surface of the silicon comprising layer exposed by the removal of the silicon comprising layer of a partial thickness), to form a diffusion region and a halo in the silicon comprising layer 204 for short channel effects suppression. For an NMOS device, As or P ion doping may be performed. For a PMOS device, B, BF2, or In ion doping may be performed to form a source/drain extension region. Then, for the NMOS device, B, BF2, or In ion implantation is performed, and for the PMOS device, As or P ion implantation is performed. Then the dopants in the source/drain regions are activated by spike annealing at 900-1100° C. to form a source/drain halo region.

Compared with the prior art where the first ion implantation is performed in a direction towards the second side face, the present technology is easier to implement and helps to reduce the space between adjacent semiconductor bodies, the area occupied by the device, and thus the manufacturing cost. The specific process parameters of the first ion implantation, e.g., the implantation energy, the implantation dose, the number of implantation times, and the doping particles, can be adjusted according to the product designs, and detailed descriptions thereof are omitted for clarity.

Figure 16:
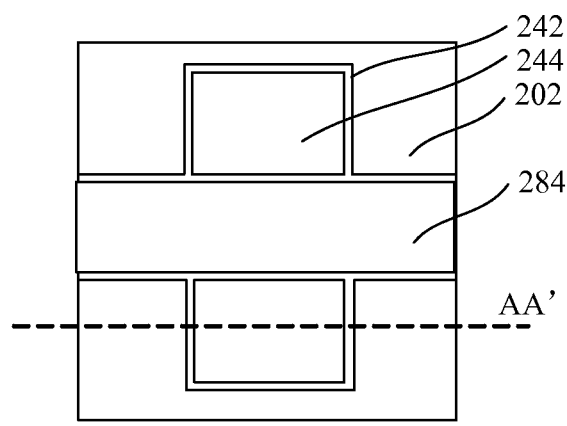
FIG. 16 and FIG. 17 respectively show a top view and a sectional view of a structure after a second semiconductor layer is formed on a source/drain base layer during manufacturing of a semiconductor device according to embodiments of the present technology.
Figure 17:
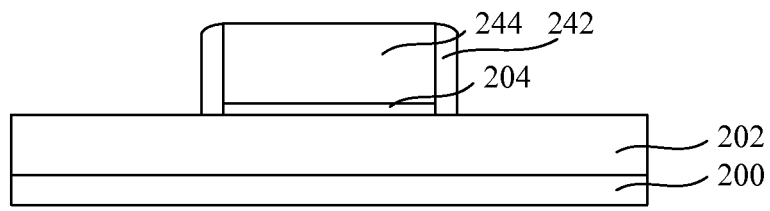

As shown in FIGS. 16 and 17, a second semiconductor layer 244 is formed by an epitaxial process on the source/drain base layer to form the source/drain regions. For a PMOS device, the material of the second semiconductor layer 244 comprises Si1–xGex, wherein the range of x is preferably 15%-75%. For an NMOS device, the material of the second semiconductor layer 244 comprises Si:C, and the doping percentage of C is preferably 0.2%-2%. Preferably, doping in situ is performed during epitaxial growth of the second semiconductor layer. For a PMOS device, p-type ion (e.g., B) doping in situ is performed. The doping dose may be $1\times10^{19}$/cm3-$1\times10^{21}$/cm3 or other suitable values. For an NMOS device, n-type ion (e.g., P) doping in situ is performed. The doping dose may be $1\times10^{19}$/cm3-$1\times10^{21}$/cm3 or other suitable values.

The epitaxial growth of the stress-inducing material for the source/drain regions makes the channel region stressed. For example, for a PMOS device, the source/drain regions produce compressive stress. For an NMOS device, the source/drain regions produce tensile stress. The stress in the channel region of the device is adjusted to further increase the carrier mobility in the channel region. On the other hand, the source/drain regions may also be formed by, after the portions of the stop layer 206 in the source/drain regions are removed, performing ion implantation to the silicon comprising layer 204 instead of removing the silicon comprising layer 204 of a partial thickness.

Figure 18:
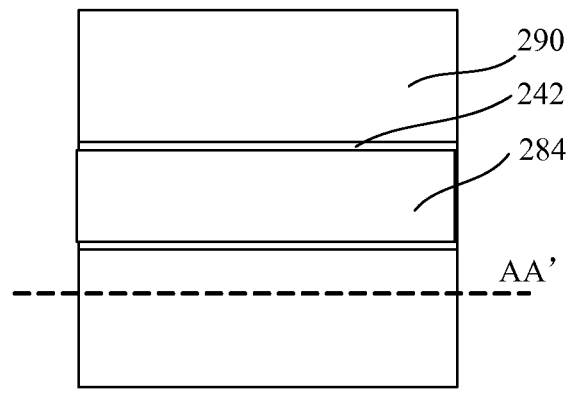
FIG. 18 and FIG. 19 respectively show a top view and a sectional view of a structure after planarizing a first dielectric layer during manufacturing of a semiconductor device according to embodiments of the present technology.
Figure 19:
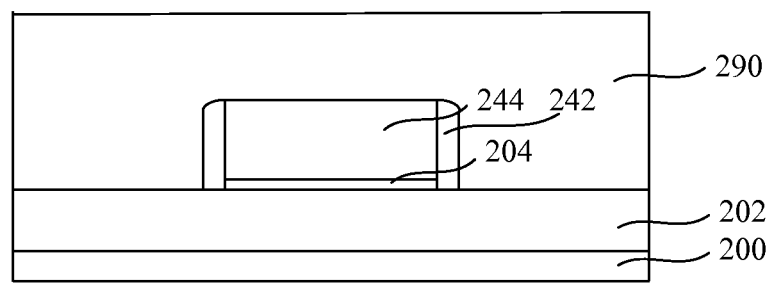

Next, a cavity is formed. Firstly, as shown in FIGS. 18 and 19, a planarized first dielectric layer 290 (e.g., silicon oxide) is formed, and the second assistance mask layer 284 of the assistance mask layer is exposed. The operation of exposing the second assistance mask layer 284 may be performed by CMP (chemical mechanical polishing).

Figure 20:
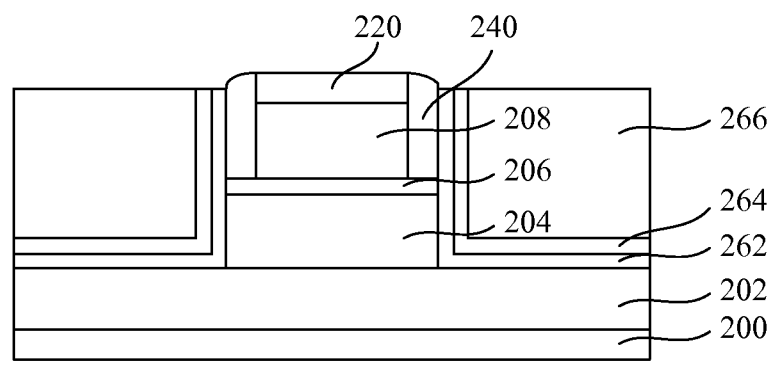
FIG. 20 shows a sectional view of a structure after gates are formed during manufacturing of a semiconductor device according to embodiments of the present technology.

Then, as shown in FIG. 20, the second assistance mask layer 284 (the silicon nitride layer) and the first assistance mask layer 282 (the silicon oxide layer) are removed, and the gate stack of a partial thickness is also removed, so as to form the gates 266. In the thickness direction of the silicon comprising layer 204, the gates 266 are at least higher than the silicon comprising layer 204 (which is for forming the channel), which helps to increase the effective area of the channel region in the device, and thus increase the carrier mobility in the channel region.

Figure 21:
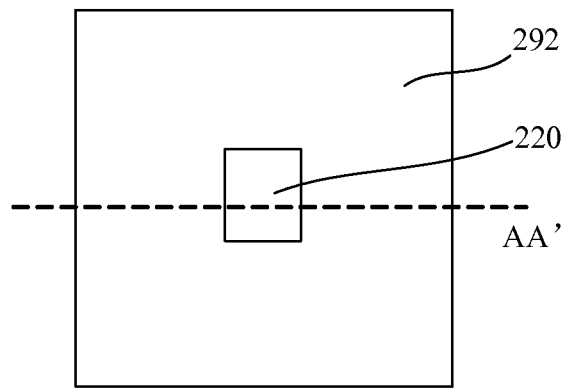
FIG. 21 and FIG. 22 respectively show a top view and a sectional view of a structure after planarizing a second dielectric layer during manufacturing of a semiconductor device according to embodiments of the present technology.
Figure 22:
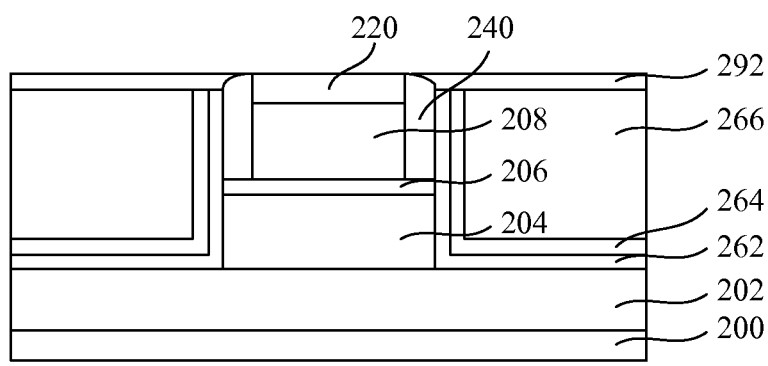
Figure 23:
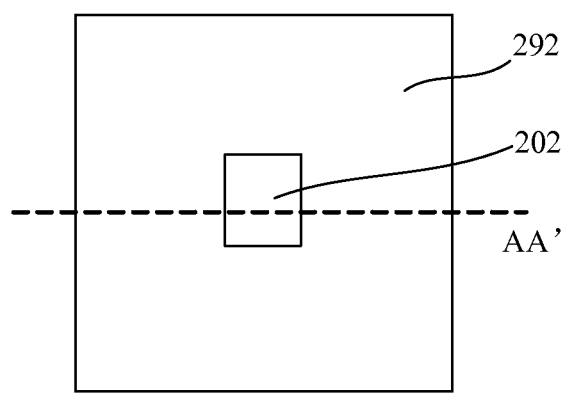
FIG. 23 and FIG. 24 respectively show a top view and a sectional view of a structure after a cavity is formed during manufacturing of a semiconductor device according to embodiments of the present technology.
Figure 24:
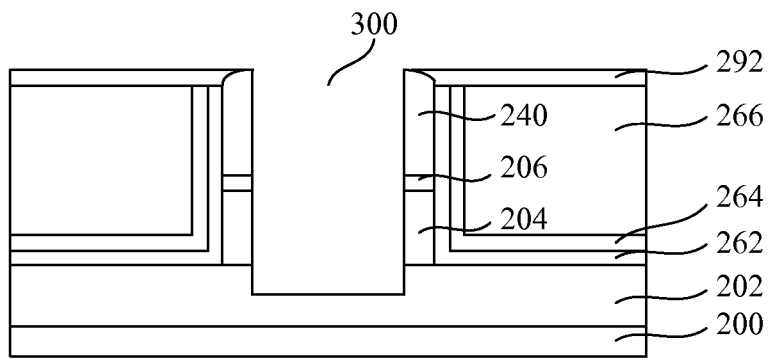

After this operation, some of the protection layer 220 still remains. Then as shown in FIGS. 21 and 22, a second dielectric layer 292 (e.g., silicon oxide, which is used to reduce damages to the existing structure when the protection layer 220 is removed to form the cavity) is formed. The second dielectric layer 292 exposes the protection layer 220 but covers the first spacer 240 and the second spacer 242. The above operation may be performed by first depositing the second dielectric layer 292 and then performing CMP on the second dielectric layer 292. Then, as shown in FIGS. 23 and 24, the protection layer 220, the sacrificial layer 208, the stop layer 206, the silicon comprising layer 204, and the insulating layer 202 of a partial thickness are removed with the second dielectric layer 292 as a mask, to form the cavity 300.

Figure 25:
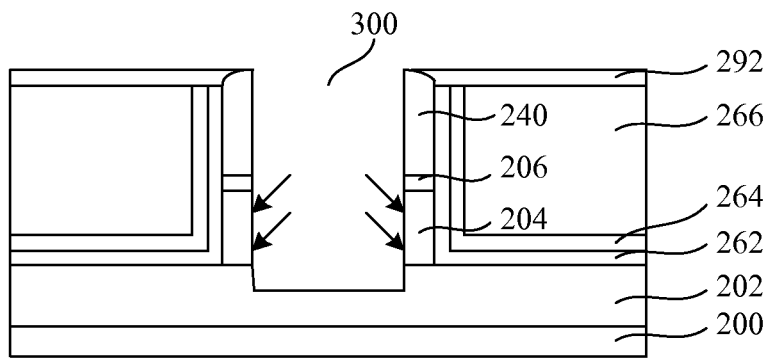
FIG. 25 shows a sectional view of a structure on which a second ion implantation is performed during manufacturing of a semiconductor device according to embodiments of the present technology.

Next, as shown in FIG. 25, after the cavity 300 is formed, a second ion implantation is performed into the cavity 300 (in a direction indicated by arrows in the FIG. 25), to form a super-steep-retrograded-well in the silicon comprising layer 204. Particularly, for an NMOS device, the channel layer comprises a p-type super-steep-retrograded-well, and for a PMOS device, the channel layer comprises an n-type super-steep-retrograded-well. Such a structure helps to make the depletion layer thinner, and further reduce the short channel effects. The specific process parameters of the second ion implantation, e.g., the implantation energy, the implantation dose, the number of implantation times, and the doping particles, may be adjusted according to the product designs, and detailed descriptions thereof are omitted for clarity.

Figure 26:
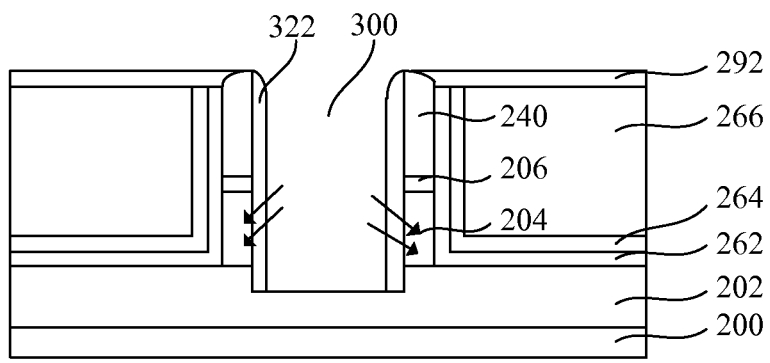
FIG. 26 shows a sectional view of a structure on which a third ion implantation is performed during manufacturing of a semiconductor device according to embodiments of the present technology.

As shown in FIG. 26, a third spacer 322 is formed in the cavity 300, and the third spacer 322 is at least higher than the silicon comprising layer 204 in a direction perpendicular to the substrate 200. The material of the third spacer 322 may comprise any one of hafnium based oxide, aluminum oxide, lanthanum oxide, zirconium oxide, silicon oxide, and silicon oxynitride, or any combination thereof. The thickness of the third spacer 322 may be 3-15 nm or other suitable values.

Then, a third ion implantation is performed to form a halo super-steep-retrograded-well in the channel. The halo super-steep-retrograded-well helps to further reduce the short channel effects and increase the controllability of the threshold voltage. Preferably, the dopant polarity of the halo super-steep-retrograded-well is opposite to that of the super-steep-retrograded-well. For example, for an NMOS device, an n-type halo super-steep-retrograded-well is formed, with any one of As and P, or any combination thereof doped therein. For a PMOS device, a p-type halo super-steep-retrograded-well is formed, with any one of B, BF2, and In, or any combination thereof doped therein. Then annealing is performed to activate the dopants. Preferably, laser annealing is used to prevent the dopants from diffusing though other annealing techniques may also be used.

Figure 27:
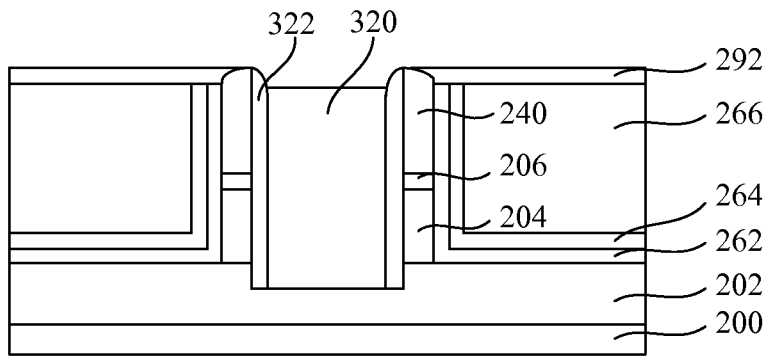
FIG. 27 shows a sectional view of a structure after a back gate is filled in the cavity during manufacturing of a semiconductor device according to embodiments of the present technology.

Optionally, as shown in FIG. 27, a third dielectric layer 320 is formed in the cavity 300 in which the third spacer 322 has been formed. The third dielectric layer 320 may comprise an insulating material (and thus is called an insulating body). The third dielectric layer 320 may adopt any material(s) different from the second dielectric layer 292, e.g., silicon nitride. The insulating body 320 is formed in the cavity 300. The stress (e.g., tensile stress for a PMOS device, and compressive stress for an NMOS device) in the insulating body can be adjusted, such that the stress in the insulating body will act on the semiconductor body to produce an opposite type of stress in the semiconductor body (i.e., compressive stress in the semiconductor body for the PMOS device, and tensile stress in the semiconductor body for the NMOS device). This helps to further adjust the stress in the channel region of the device to further improve the carrier mobility in the channel region. The insulating body at least covers the patterned first semiconductor layer 204, which helps to apply the stress uniformly to the channel region of the device. The material of the insulating body comprises any one of silicon nitride and silicon oxide, or any combination thereof.

Figure 28:
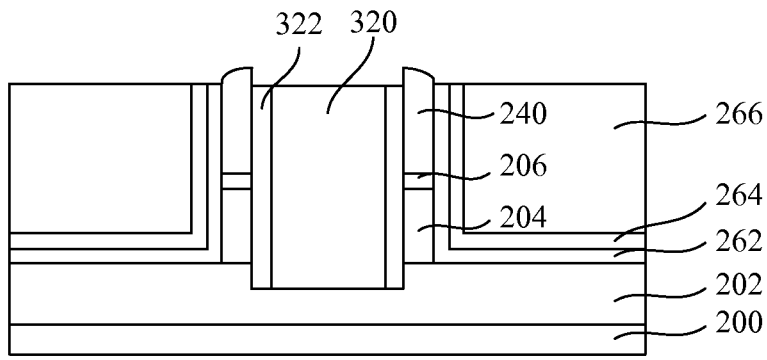
FIG. 28 and FIG. 29 respectively show cross-sectional views of a structure after a second dielectric layer is removed to expose gates, a back gate, and source/drain regions during manufacturing of a semiconductor device according to embodiments of the present technology.
Figure 29:
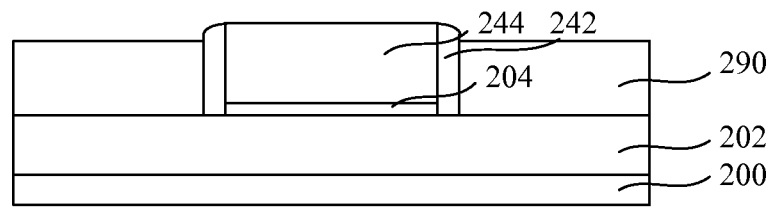
Figure 30:
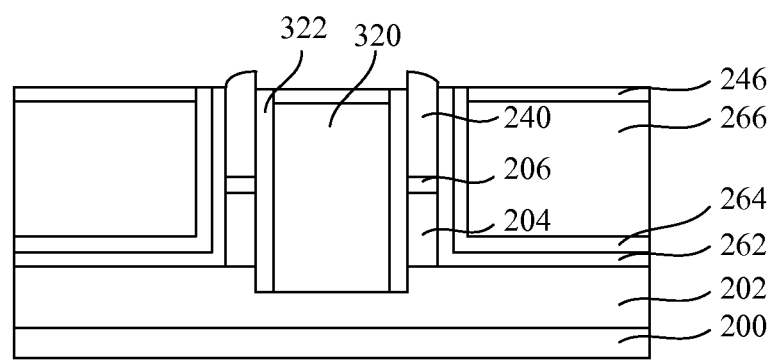
FIG. 30 and FIG. 31 respectively show cross-sectional views of a structure after contact regions are formed on gates, a back gate, and source/drain regions according to embodiments of the present technology.
Figure 31:
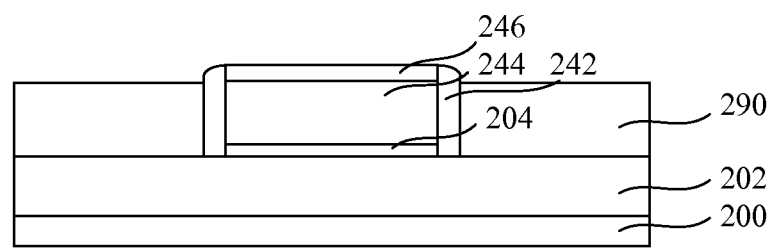

As shown in FIGS. 28 and 29, the second dielectric layer 292 is removed to expose the gates 266 and the source/drain regions 244. Next, as shown in FIGS. 30 and 31, a metal layer is formed on the gates 266, the source/drain regions 244, and the back gate 320. Then a thermal process is performed, and the unreacted metal layer is removed, so as to form a metal silicide layer 246 (i.e., a contact region for reducing the contact resistance in subsequent formation of metal interconnections) on the gates 266, the source/drain regions 244, and the back gate 320. According to another embodiment of the present invention, the third spacer 322, and optionally the first spacer 240 and the stop layer 206, may be removed after the halo super-steep-retrograded-well is formed and before the insulating body 320 is formed.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A semiconductor device, comprising:
   a semiconductor substrate;
   an insulating layer on the semiconductor substrate;
   a semiconductor body on the insulating layer;
   a cavity formed in the semiconductor body and into the insulating layer;
   source/drain regions abutting opposite first side faces of the semiconductor body;
   gates located on opposite second side faces of the semiconductor body;
   a channel layer interposed between the respective second side faces and the cavity; and
   a super-steep-retrograded-well and a halo super-steep-retrograded-well formed in the channel layer, wherein the super-steep-retrograded-well and the halo super-steep-retrograded-well have opposite dopant polarities.

2. The semiconductor device according to claim 1, wherein for an NMOS device, the super-steep-retrograded-well is p-type; and for a PMOS device, the super-steep-retrograded-well is n-type.

3. The semiconductor device according to claim 1, further comprising a spacer located in the cavity and abutting the channel layer.

4. The semiconductor device according to claim 3, wherein the spacer has a thickness of 3-15 nm in a direction generally perpendicular to the channel layer.

5. The semiconductor device according to claim 1, wherein the gate covers at least a portion of the channel layer in a direction perpendicular to the semiconductor body.

6. The semiconductor device according to claim 1, further comprising a semiconductor assistance body, wherein an upper surface of the semiconductor assistance body is lower than an upper surface of the semiconductor body, and wherein the semiconductor assistance body abuts the first side faces, and wherein the source/drain regions are on the semiconductor assistance body.

7. The semiconductor device according to claim 6, wherein the semiconductor assistance body comprises Si, wherein for a PMOS device, the source/drain regions comprise Si1−xGex where 0<x<1; and for an NMOS device, the source/drain regions comprise Si:C.

8. The semiconductor device according to claim 7, wherein x in Si1−xGex has a value in a range of about 0.1 to about 0.7.

9. The semiconductor device according to claim 7, wherein an atom percentage of C in Si:C is in a range of about 0.2% to about 2%.

10. The semiconductor device according to claim 1, further comprising an insulating body in the cavity.

11. The semiconductor device according to claim 10, wherein the insulating body has a tensile stress in a PMOS device and has a compressive stress in an NMOS device.

12. The semiconductor device according to claim 10, wherein the material of the insulating body comprises one of silicon nitride, silicon oxide, and a combination thereof.

13. The semiconductor device according to claim 10, wherein the insulating body covers at least a portion the channel layer in a direction generally perpendicular to the insulating layer.

14. A method for manufacturing a semiconductor device, comprising:
   forming an insulating layer on a semiconductor substrate;
   forming a semiconductor base on the insulating layer, wherein the semiconductor base comprises a first semiconductor layer;
   forming source/drain regions abutting opposite first side faces of the semiconductor base;
   forming gates on opposite second side faces of the semiconductor base;
   removing portions of both the semiconductor base and the insulating layer to form a cavity in the semiconductor base and into the insulating layer so as to expose portions of the first semiconductor layer between the respective second side faces and the cavity, thereby forming a channel layer;
   forming a super-steep-retrograded-well in the first semiconductor layer;
   forming a first spacer in the cavity, the first spacer abutting the channel layer; and
   forming a halo super-steep-retrograded-well in the first semiconductor layer, wherein the halo super-steep-retrograded-well and the super-steep-retrograded-well have opposite dopant polarities.

15. The method according to claim 14, wherein forming the semiconductor base comprises:
   forming, on the insulating layer, the first semiconductor layer, a stop layer, a patterned sacrificial layer, a patterned protection layer, and a second spacer surrounding the patterned sacrificial layer and the patterned protection layer;
   patterning the stop layer and the first semiconductor layer with the second spacer as a mask;
   forming the source/drain regions by removing portions of the second spacer, the protection layer, and the sacrificial layer covering the source/drain regions, so as to expose the stop layer;
   forming a third spacer surrounding the protection layer and the sacrificial layer; and
   wherein forming the cavity in the semiconductor base comprises:
   removing the protection layer, the sacrificial layer, the first semiconductor layer, and the insulating layer with the second spacer and the third spacer as a mask, the material of the stop layer being different from the materials of the protection layer, the sacrificial layer, the first semiconductor layer, the second spacer, and the third spacer.

16. The method according to claim 15, wherein the step of forming the source/drain regions comprises:
   after forming the semiconductor base, removing the stop layer and removing the first semiconductor layer of a partial thickness which are located in the source/drain regions, so as to form a source/drain base layer; and
   forming a second semiconductor layer on the source/drain base layer.

17. The method according to claim 16, wherein the first semiconductor layer comprises Si; for a PMOS device, the second semiconductor layer comprises Si1−xGex wherein 0<x<1; and for an NMOS device, the second semiconductor layer comprises Si:C.

18. The method according to claim 17, wherein x in Si1−xGex has a value in a range of about 0.1 to about 0.7.

19. The method according to claim 17, wherein the atom percentage of C in Si:C is in a range of about 0.2% to about 2%.

20. The method according to claim 16, wherein, before forming the second semiconductor layer on the source/drain base layer, the method further comprises: performing a first ion implantation in a direction towards the first side faces to form a diffusion region and a halo.

21. The method according to claim 14, wherein the gate covers at least a portion of the channel layer in a direction perpendicular to the semiconductor base.

22. The method according to claim 14, wherein the first spacer has a thickness of about 3-15 nm in a direction generally perpendicular to the channel layer.

23. The method according to claim 14, wherein for an NMOS device, a p-type super-steep-retrograded-well is formed, and for a PMOS device, an n-type super-steep-retrograded-well is formed.

24. The method according to claim 14, further comprising filling the cavity with an insulating material to form an insulating body.

25. The method according to claim 24, wherein the insulating material comprises one of silicon nitride, silicon oxide, and a combination thereof.

26. The method according to claim 24, wherein the insulating body at least covers the channel layer.

27. The method according to claim 24, wherein the insulating body has a tensile stress in a PMOS device, and has a compressive stress in an NMOS device.

* * * * *